US011089721B2

United States Patent
Sugihara

(10) Patent No.: US 11,089,721 B2
(45) Date of Patent: Aug. 10, 2021

(54) COMPONENT SUPPLY SYSTEM

(71) Applicant: FUJI CORPORATION, Chiryu (JP)

(72) Inventor: Akio Sugihara, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 191 days.

(21) Appl. No.: 16/304,834

(22) PCT Filed: May 31, 2016

(86) PCT No.: PCT/JP2016/065970
§ 371 (c)(1),
(2) Date: Nov. 27, 2018

(87) PCT Pub. No.: WO2017/208325
PCT Pub. Date: Dec. 7, 2017

(65) Prior Publication Data
US 2020/0170154 A1    May 28, 2020

(51) Int. Cl.
*G06F 7/00* (2006.01)
*H05K 13/08* (2006.01)
*H05K 13/02* (2006.01)

(52) U.S. Cl.
CPC ......... *H05K 13/0813* (2018.08); *H05K 13/02* (2013.01); *H05K 13/0812* (2018.08)

(58) Field of Classification Search
CPC ........... H05K 13/0813; H05K 13/0812; H05K 13/02; H05K 13/021; B23P 21/00; B23P 19/00
USPC ................................................ 700/213, 228
See application file for complete search history.

(56) References Cited

U.S. PATENT DOCUMENTS

2018/0305053 A1* 10/2018 Schombert .............. B65B 35/26
2019/0357396 A1* 11/2019 Matsumoto ............ B25J 9/1697

FOREIGN PATENT DOCUMENTS

JP    8-323669 A    12/1996

OTHER PUBLICATIONS

International Search Report dated Aug. 16, 2016 in PCT/JP2016/065970 filed on May 31, 2016.

* cited by examiner

*Primary Examiner* — Yolanda R Cumbess
(74) *Attorney, Agent, or Firm* — Oblon, McClelland, Maier & Neustadt, L.L.P.

(57) ABSTRACT

A loose component supply device in which a stage on which components are scattered is imaged by an imaging device and the area of the stage imaged by the imaging device is divided into 20×20 blocks. A difference value between first imaging data that is imaging data of the stage without any components loaded and second imaging data that is imaging data of the stage after component supply has been started and components replenished onto the stage is calculated for each block. If the difference value is equal to or greater than a threshold value, it is determined that a component is present in the block, and if it is determined that the quantity of blocks for which it is determined that a component is present is equal to or less than a set quantity, components are replenished to the stage.

7 Claims, 18 Drawing Sheets

COMPONENT SUPPLY SYSTEM

TECHNICAL FIELD

The present application relates to a component supply system configured to supply components in a state scattered on a stage.

BACKGROUND ART

There is a known component supply system that supplies components in a state scattered on a stage. With such a system, it is necessary to replenish components on the stage at an appropriate timing, so it is necessary to estimate the quantity of components remaining on the stage. Technology for determining the quantity of components in a specified area, the presence of a component, and so on is disclosed in the following patent literature.

Patent literature 1: JP-A-H8-323669

BRIEF SUMMARY

Technical Problem

By using technology disclosed in the above patent literature, it is possible to a certain extent to estimate the quantity of components remaining on the stage and to replenish components on the stage. However, there remain various demands such as for an easier estimation method, and a way to achieve more appropriate timing for replenishing components, and the practicality of a component supply system can be improved by satisfying these demands. An object of the present disclosure is to provide a highly practical component supply system that takes account of the above circumstances.

Solution to Problem

To solve the above problems, a component supply system of the present disclosure includes: a stage configured such that multiple components are loaded in a scattered state on the stage to supply the components; a replenishing device configured to replenish the components on the stage; an imaging device configured to image the stage; and a determining device configured to determine whether to replenish the components on the stage from the replenishing device based on first imaging data that is imaging data captured by the imaging device of the stage in a state without the components loaded on the stage, and second imaging data that is imaging data captured by the imaging device of the stage after the components have been replenished from the replenishing device and supplying of the components has been started by the component supply system.

Advantageous Effects

With a component supply system of the present disclosure, the timing for replenishing the components on the stage from the replenishing device is determined based on first imaging data that is imaging data captured by the imaging device of the stage in a state without the components loaded on the stage, and second imaging data that is imaging data captured by the imaging device of the stage after the components have been replenished from the replenishing device and supplying of the components has been started by the component supply system. Thus, it is possible to determine the timing for replenishment from the replenishing device simply by comparing the first imaging data and the second imaging data, making the determining method easy. Also, by comparing the first imaging data for which it is obvious that components are not present and the second imaging for which the presence of components is unknown, it is possible to appropriately determine the presence of components, to even more appropriately determine the timing for component replenishment. In this manner, a component supply system of the present disclosure achieves higher practicality.

DESCRIPTION OF PREFERRED EMBODIMENTS

The following describes in detail referring to the figures an example embodiment of the present disclosure.

Configuration of Component Mounter

Figure 1:
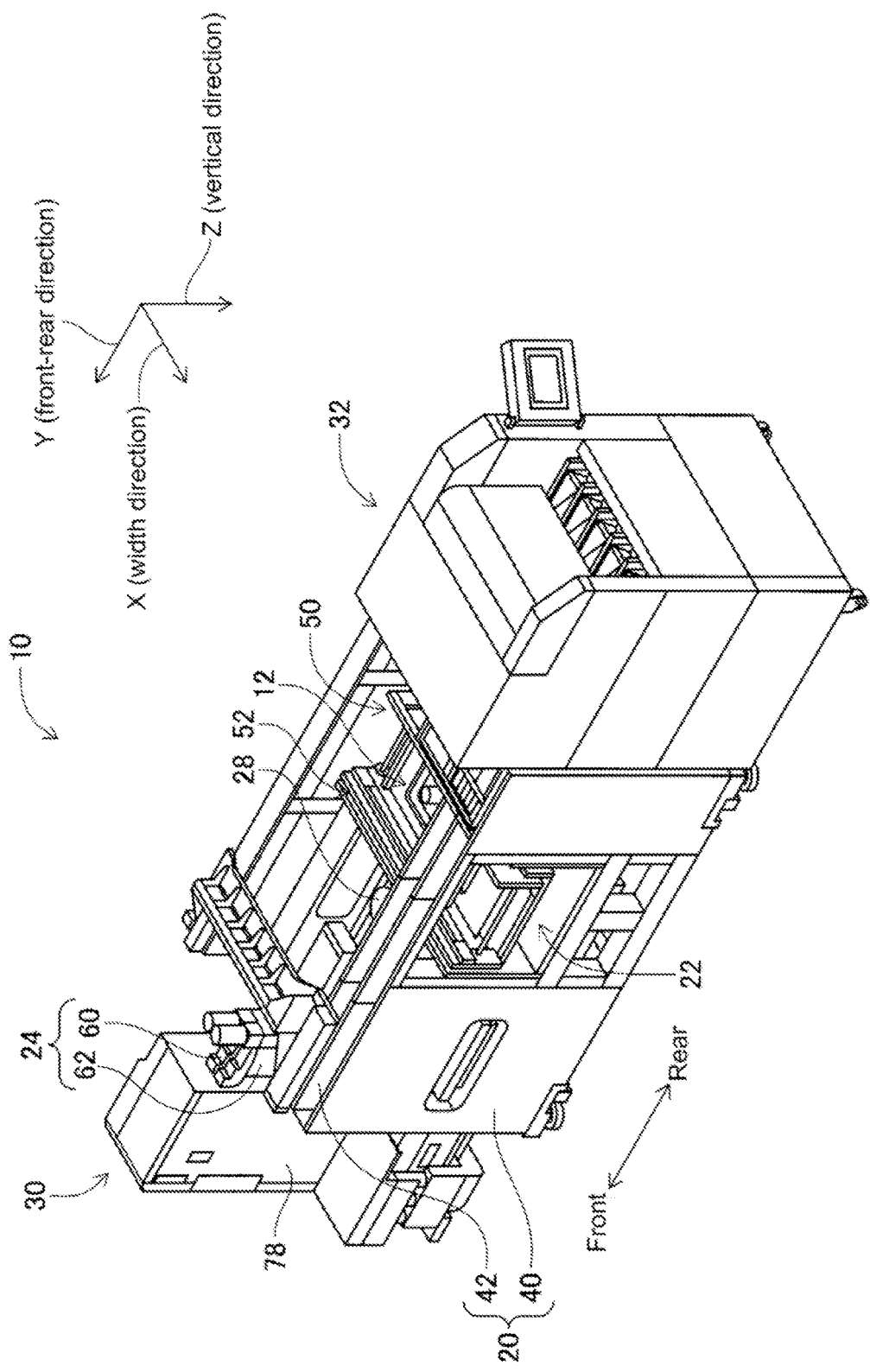
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, imaging device 28, component supply device 30, loose component supply device 32, and control device 34 (refer to FIG. 11). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40.

Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
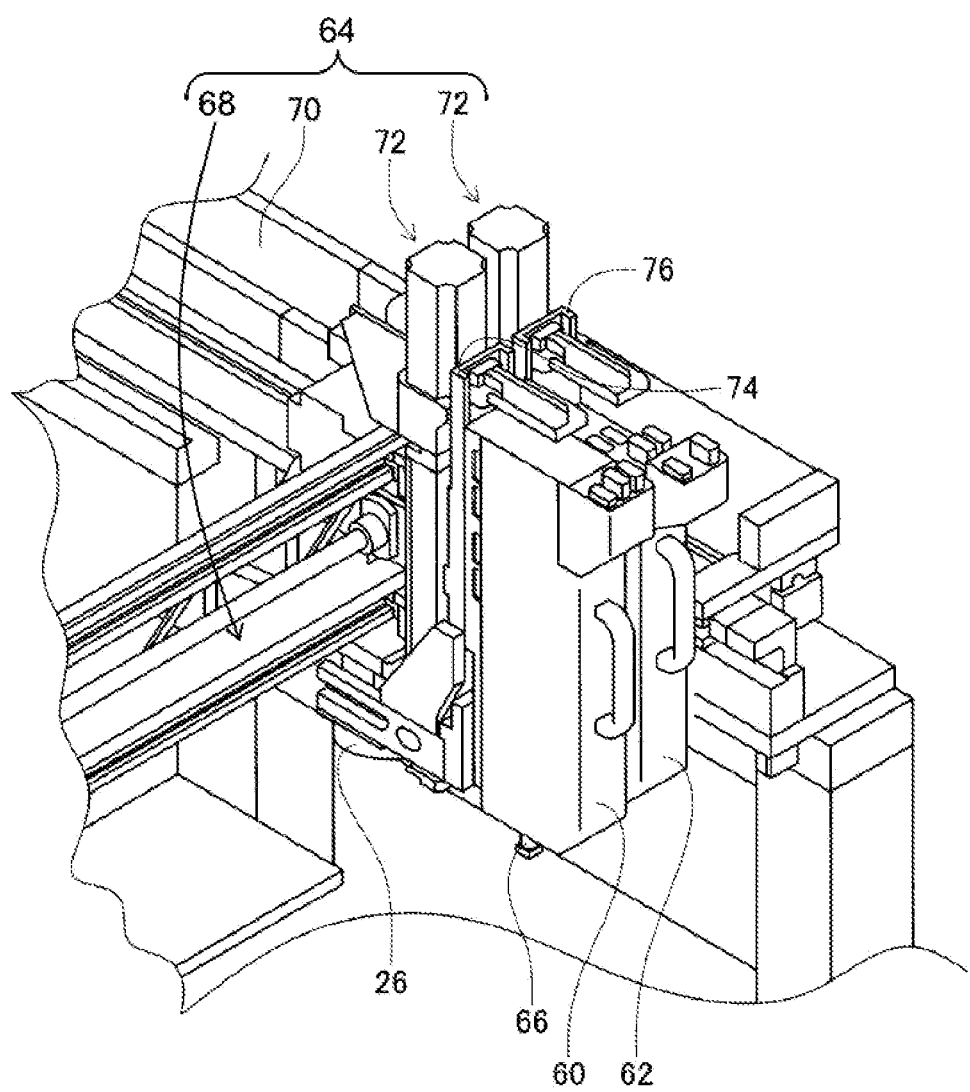
FIG. 2 is a perspective view of a component mounting device of the component mounter.

Component mounting device 24 is provided on beam section 42, and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

As shown in FIG. 2, imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
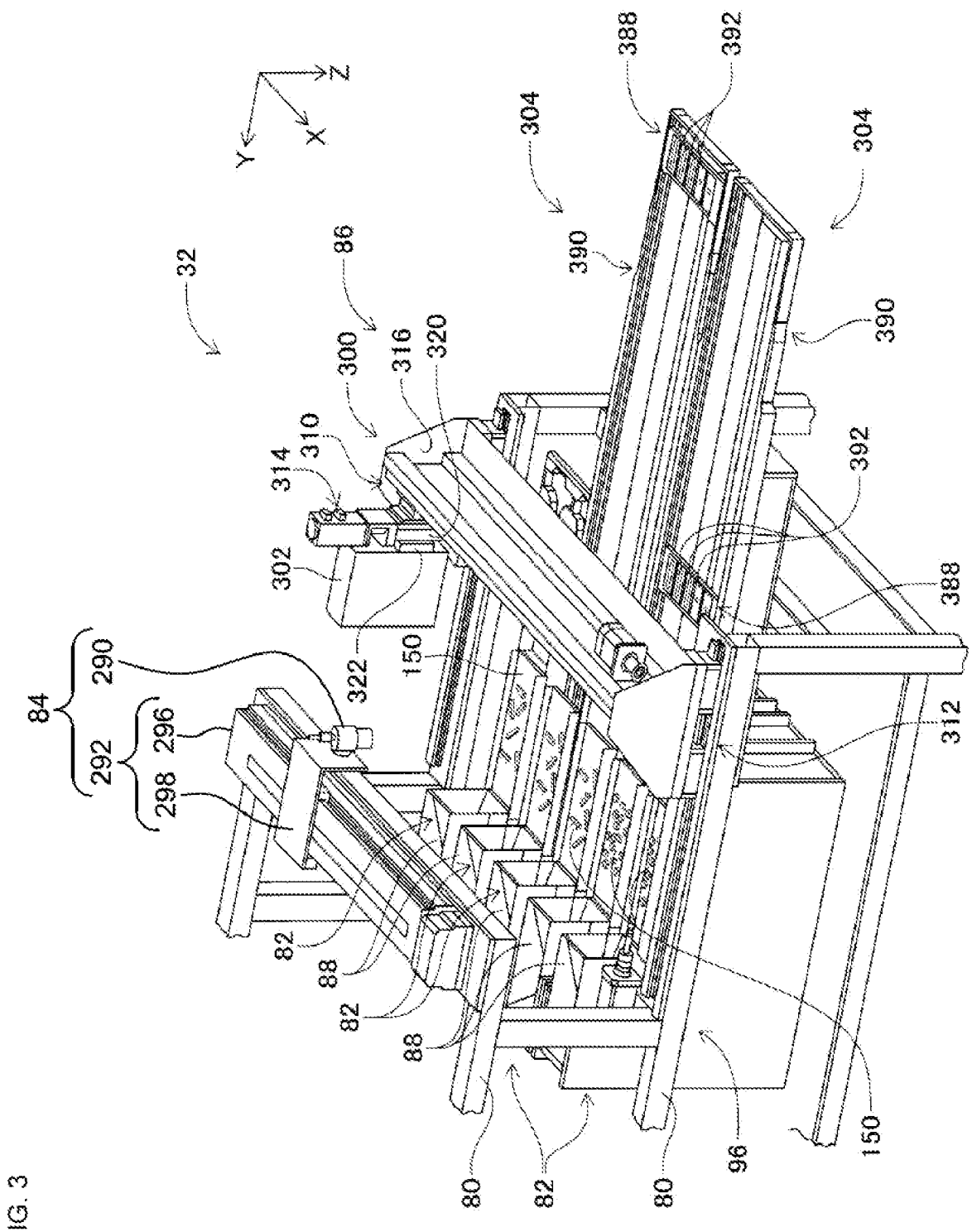
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90 (refer to FIG. 4), and component returning device 92 (refer to FIG. 5), with component supply apparatus 88, component scattering device 90, and component returning device 92 being integrated into one unit. Component supply unit 82 is assembled to be removable from base 96 of main body 80, and with loose component supply device 32, five component supply units 82 are arranged in one row in the X direction.

(i) Component Supply Apparatus

Figure 4:
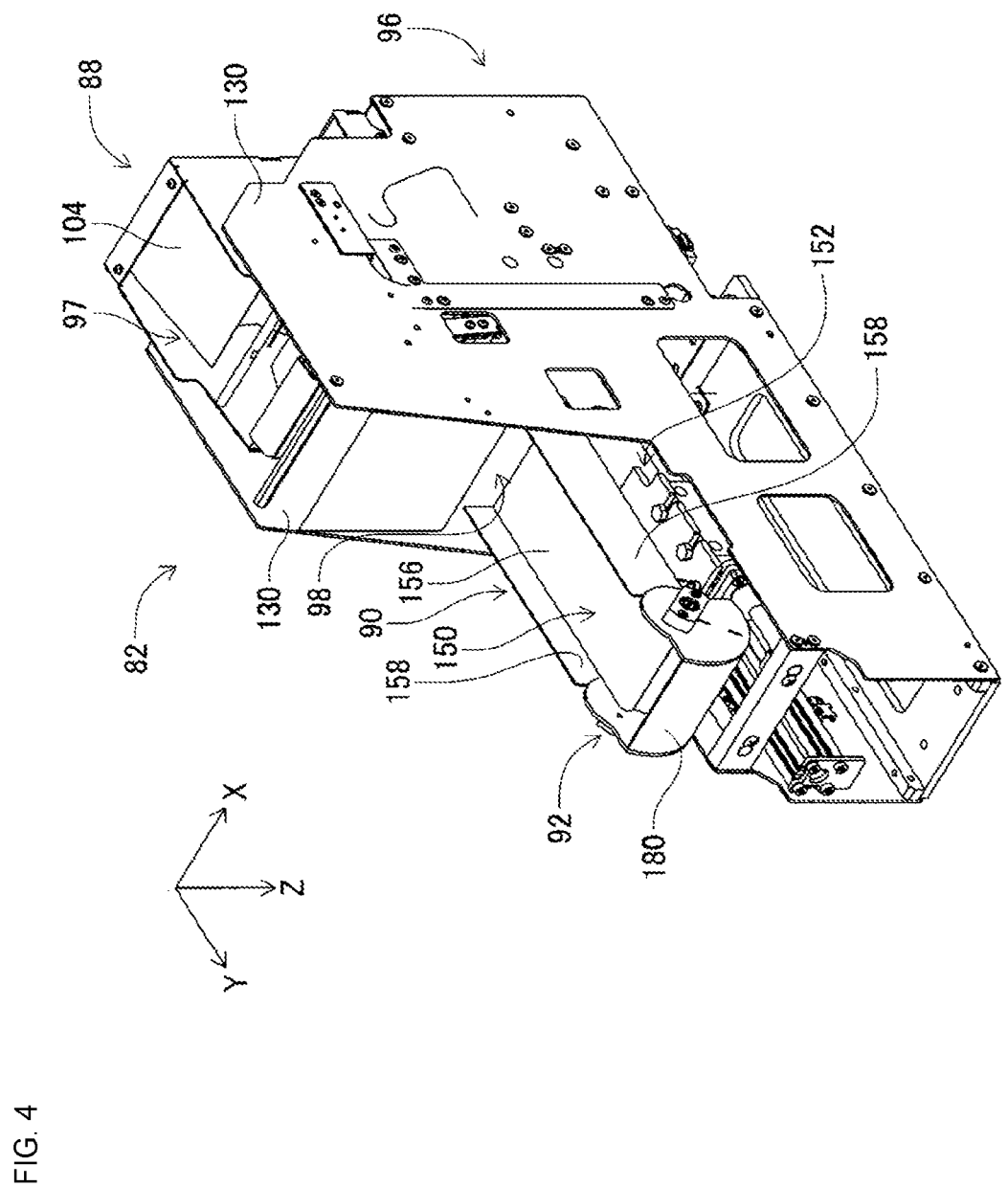
FIG. 4 is a perspective view of a component supply unit.
Figure 5:
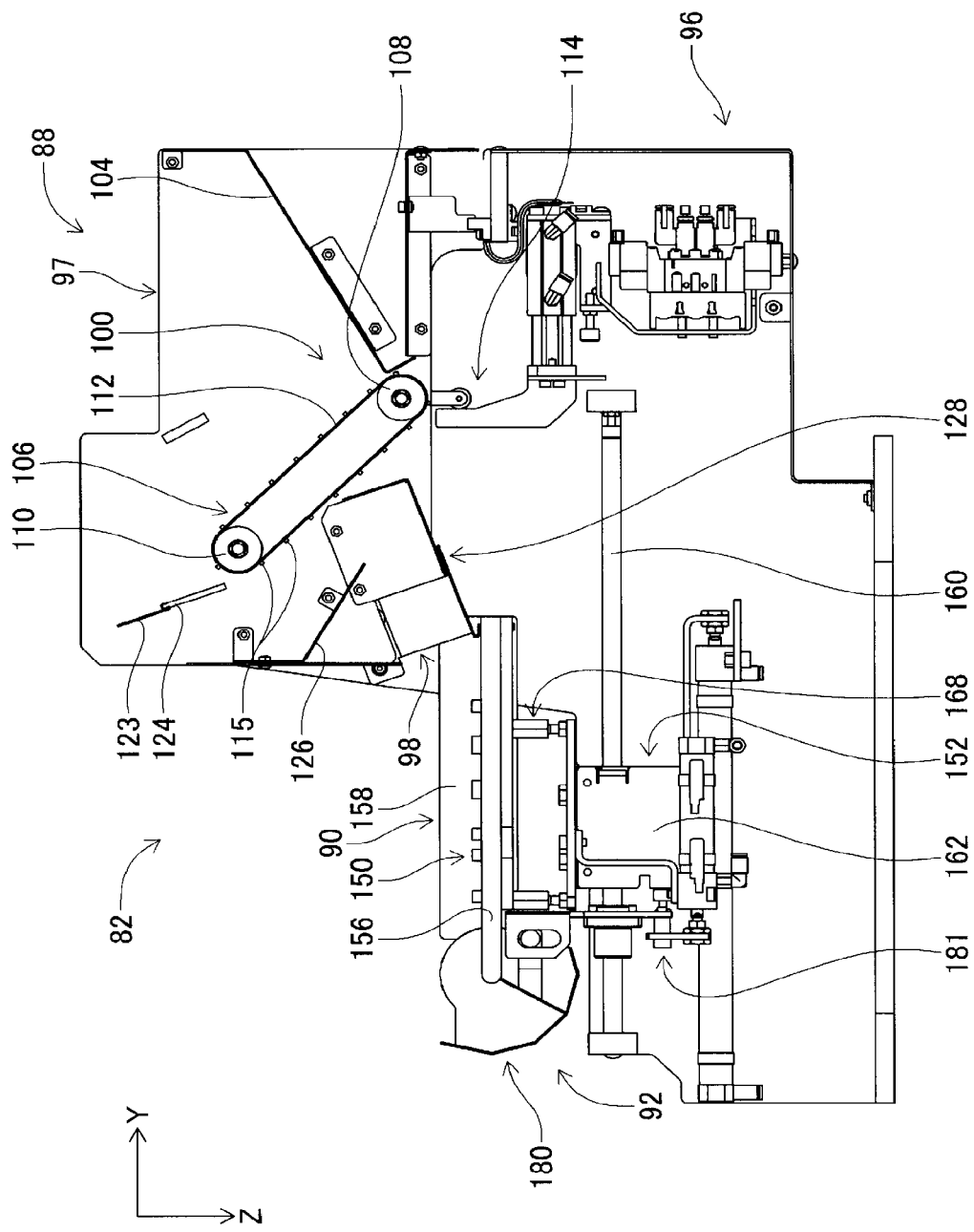
FIG. 5 is a cross section view of the component supply unit.

As shown in FIGS. 4 and 5, component supply apparatus 88 is a substantially cuboid box arranged to extend in the Y direction. The Y direction is the front-rear direction of component supply apparatus 88 with the left side in FIG. 5 sometimes referred to as the front and the right side in FIG. 5 sometimes referred to as the rear. That is, in component supply unit 82, the side towards the end at which component returning device 92 is arranged is sometimes referred to as the front, and the side towards the end at which component supply apparatus 88 is arranged is sometimes referred to as the rear.

Component supply apparatus 88 has openings at the upper surface and front surface; the opening at the upper surface is component insertion opening 97 and the opening at the front surface is component discharge opening 98. With component supply apparatus 88, inclined plate 104 is provided below insertion opening 97. Inclined plate 104 is arranged across the entire width (X direction) of component supply apparatus 88 and is inclined from the rear end surface of component supply apparatus 88 towards the center such that the front end of inclined plate 104 is positioned lower than the rear end.

Also, as shown in FIG. 5, conveyor device 106 is arranged at the front side of inclined plate 104. Conveyor device 106 includes a pair of rollers 108 and 110, and conveyor belt 112. Each of the rollers 108 and 110 are arranged inside component supply apparatus 88 extending in the width direction of component supply apparatus 88 across the entire width of component supply apparatus 88. Further, roller 108 faces the front end of inclined plate 104, that is, the lowest end of inclined plate 104, with a clearance gap between them. Note that, the clearance between the front end of inclined plate 104 and roller 108 is smaller than components that are supplied by component supply apparatus 88. Also, roller 110 is arranged diagonally above and to the front of roller 108. Conveyor belt 112 is stretched over the pair of rollers 108 and 110. Note that, conveyor belt 112 has a width slightly less than the internal width dimension of component supply apparatus 88.

Also, the pair of rollers 108 and 110 are rotatable around their center axis, with rotation being controlled by operation of rotation device 114. The rotation direction of rollers 108 and 110 is the counterclockwise direction in FIG. 5. Thus, conveyor belt 112 revolves around rollers 108 and 110 in a counterclockwise direction in FIG. 5. In other words, the conveyance direction of conveyor belt 112 is diagonally up from the front end of inclined plate 104. Multiple protrusions 115 are formed in the upper surface, that is, the conveyance surface, of conveyor belt 112 extending across the width of conveyor belt 112. The multiple protrusions 115 are formed at specified intervals in the revolving direction of conveyor belt 112 with the intervals being longer than the length direction of components supplied by component supply apparatus 88.

Also, brush holding section 123 is arranged diagonally above and in front of roller 110 of conveyor device 106. Brush holding section 123 is arranged extending in the width direction of component supply apparatus 88 across the entire width of component supply apparatus 88. Brush 124 is attached to the lower end of brush holding section 123 extending towards roller 110 of conveyor device 106. The width dimension of brush 124 is slightly smaller than the internal width dimension of component supply apparatus 88 and faces conveyor belt 112 wound around roller 110 across the entire width direction of component supply apparatus 88 with a clearance gap between brush 124 and conveyor belt 112. The clearance between the tip of brush 124 and conveyor belt 112 wound around roller 110 is longer than the thickness dimension of components supplied by component supply apparatus 88 and less than two times the thickness dimension of components supplied by component supply apparatus 88.

Also, inclined plate 126 is arranged diagonally below and in front of roller 110 of conveyor device 106. Inclined plate 126 is arranged across the entire width of component supply apparatus 88 and is inclined from the front end surface of component supply apparatus 88 to below roller 110 such that the rear end of inclined plate 126 is positioned lower than the front end. Further, inclined plate 128 is arranged below inclined plate 126. Inclined plate 128 is arranged across the entire width of component supply apparatus 88 and is inclined from below a central portion of conveyor device 106 towards discharge opening 98 of component supply apparatus 88 such that the front end of inclined plate 128 is positioned lower than the rear end. The rear end of inclined plate 128 is positioned further to the rear than the rear end of inclined plate 126, and the rear end of inclined plate 128 is bent upward at a right angle. The front end inclined plate 128 is bent to the rear to be substantially horizontal.

As shown in FIG. 4, pair of side frame sections 130 are assembled on base 96. The pair of side frame sections 130 are parallel to each other and are arranged upright extending in the Y direction. The distance between the pair of side frame sections 130 is slightly larger than the width dimension of component supply apparatus 88, with component supply apparatus 88 being detachably mounted between the pair of side frame sections 130.

(ii) Component Scattering Device

Component scattering device 90 includes component support member 150 and component support member moving device 152. Component support member 150 is configured from stage 156 and pair of side walls 158. Stage 156 is a substantially rectangular plate and is arranged extending forwards from below component supply apparatus 88 mounted between pair of side frame sections 130. Note that, the upper surface of stage 156 is substantially horizontal and, as shown in FIG. 5, is arranged with a small clearance gap from the bent front end of inclined plate 128 of component supply apparatus 88. Also, as shown in FIG. 4, pair of side walls 158 is fixed upright at both ends of stage 156 in the lengthwise direction, with the upper end of each side wall 158 extending above the upper surface of stage 156.

Further, as shown in FIG. 5, component support section moving device 152 includes guide rail 160 and slider 162. Guide rail 160 extends in the lengthwise direction of stage 156 below component support member 150. Slider 162 is slidably attached to guide rail 160 to be slid to any position by operation of electromagnetic motor 166 (refer to FIG. 11). Stage 156 of component support member 150 is connected to slider 162 via connection mechanism 168. Thus, component support member 150 moves in the Y direction by operation of component support member moving device 152, to move to and from a stored state (refer to FIG. 6) stored below component supply apparatus 88 and an exposed state (refer to FIG. 5) drawn out from below component supply apparatus 88.

(iii) Component Returning Device

Figure 7:
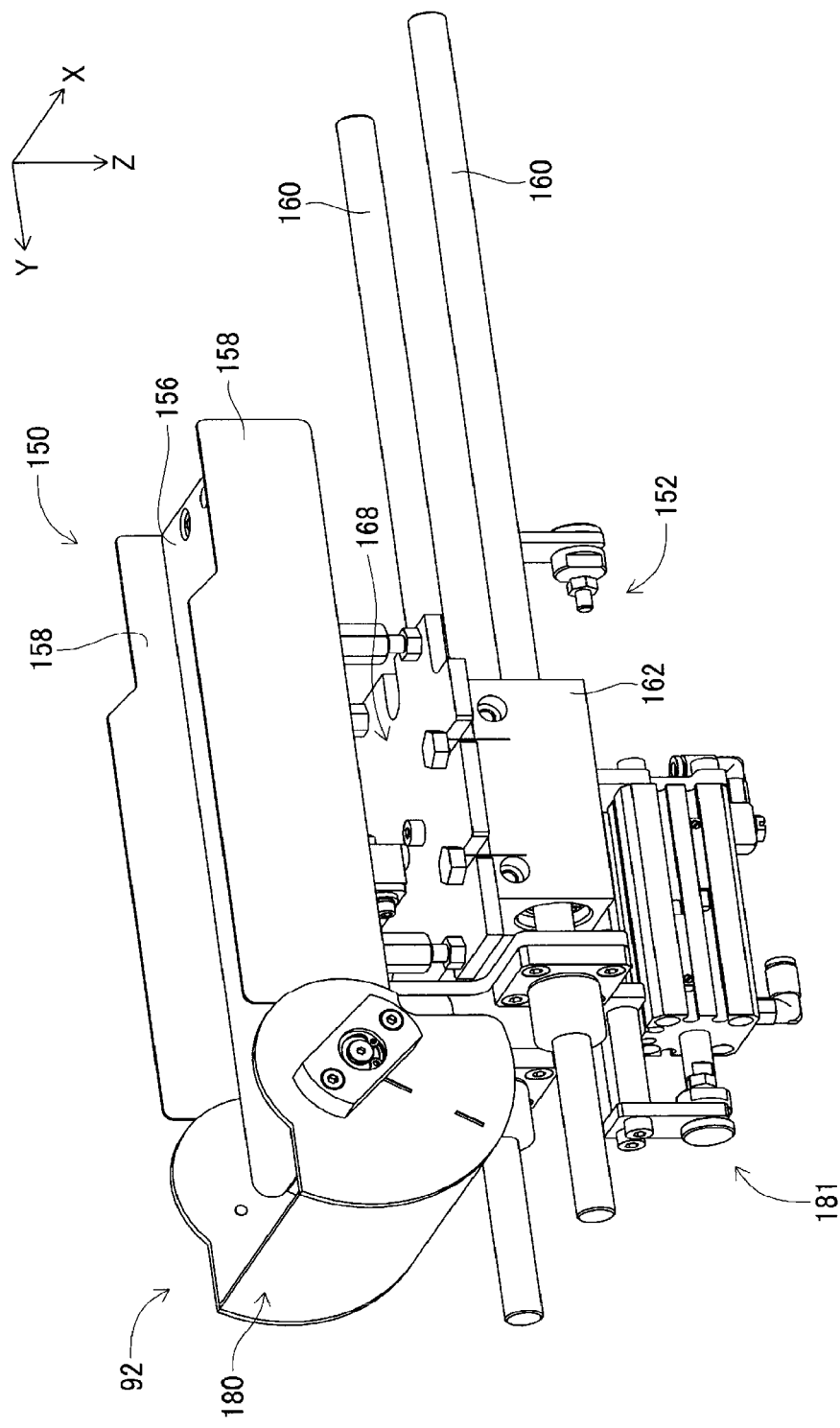
FIG. 7 is a perspective view of a component scattering device.
Figure 8:
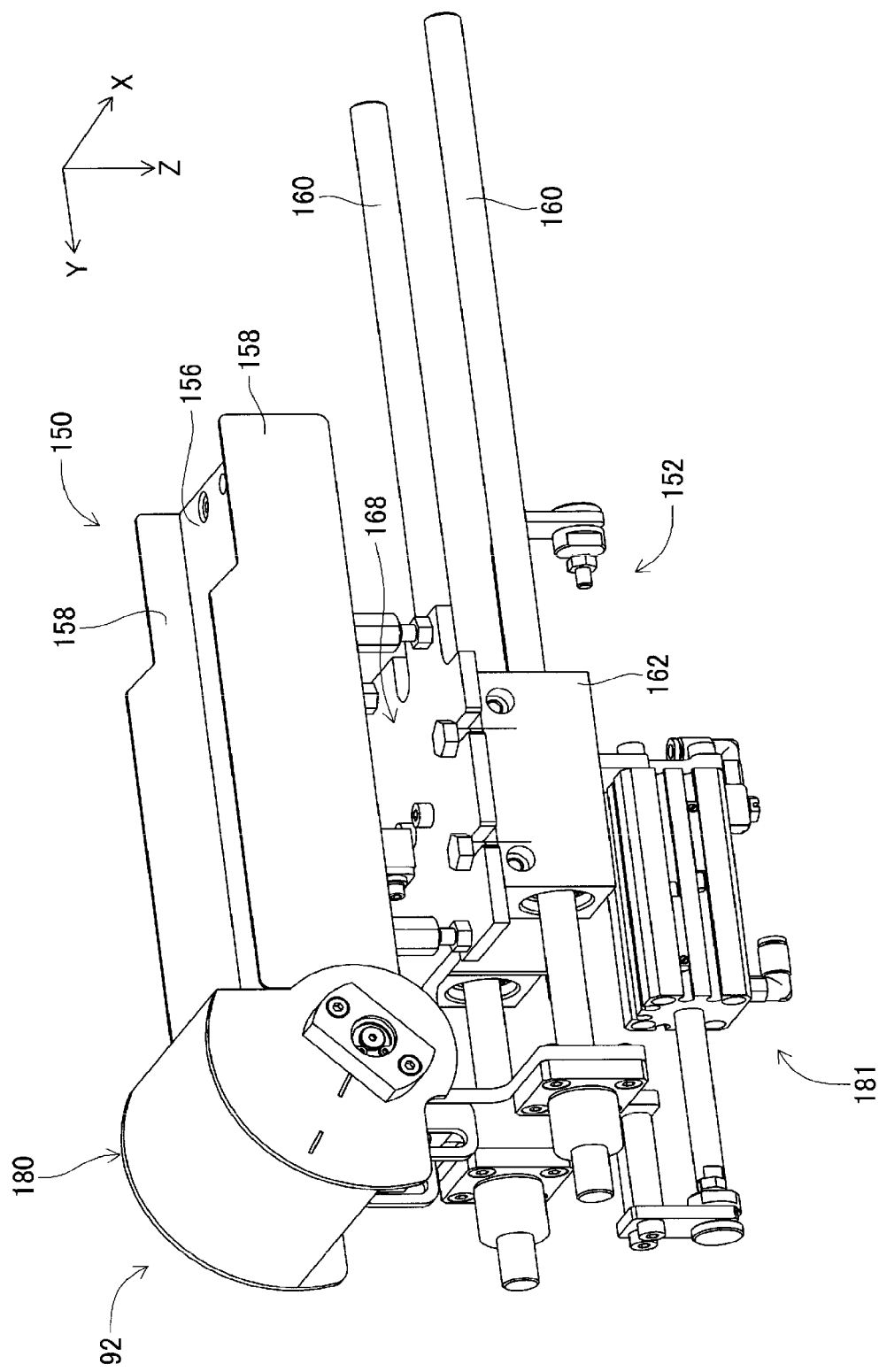
FIG. 8 is a perspective view of a component scattering device.

As shown in FIG. 7, component returning device 92 includes component collection container 180 and container oscillating device 181. Component collection container 180 is a box with an arc-shaped bottom surface. Component collection container 180 is held to be swingable around the front end stage 156 of component holding member 150 and is swung by operation of container oscillating device 181. Here, component collection container 180 is swung between a collection orientation (refer to FIG. 7) with the opening facing up, and a return orientation (refer to FIG. 8) with the opening facing the upper surface of stage 156 of component support member 150.

(b) Imaging Device

As shown in FIG. 3, imaging device 84 includes camera 290 and camera moving device 292. Camera moving 292 includes guide rail 296 and slider 298. Guide rail 296 is fixed to main body 80 above component supply apparatus 88 to extend in the width direction (X direction) of loose component supply device 32. Slider 298 is slidably attached to guide rail 296, and can be slid to any position by operation of electromagnetic motor 299 (refer to FIG. 11). Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 and extending in the X direction, and Y slider 316 is moved to any position in the Y direction by operation of electromagnetic motor 319 (refer to FIG. 14). X-direction moving device 310 includes X slider 320 provided on a side surface of Y slider 316, and X slider 320 is moved to any position in the X direction by operation of electromagnetic motor 321 (refer to FIG. 11). Z-direction moving device 314 includes Z slider 322 provided on a side surface of X slider 320, and Z slider 322 is moved to any position in the Z direction by operation of electromagnetic motor 323 (refer to FIG. 11).

Figure 9:
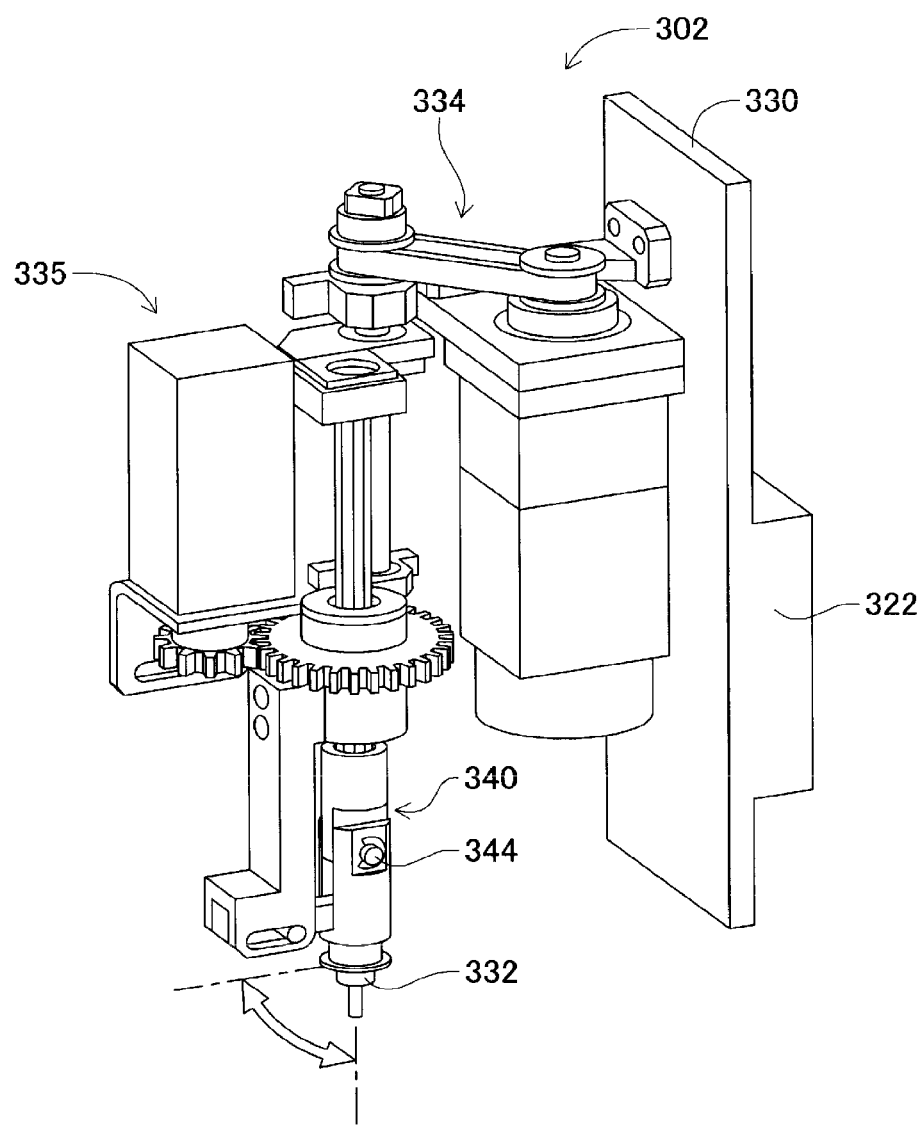
FIG. 9 is a perspective view of a component holding head.

As shown in FIG. 9, component holding head 302 includes head main body 330, suction nozzle 332, nozzle pivoting device 334, and nozzle rotating device 335. Head main body 330 is formed as one body with Z slider 322. Suction nozzle 332 is for holding a component, and is detachably attached to a lower end section of holder 340. Holder 340 is able to bend at support shaft 344, and holder 340 bends 90 degrees in an up direction by operation of nozzle pivoting device 334. By this, suction nozzle 332 attached to the bottom end of holder 340 is pivoted 90 degrees to be positioned at the pivoted position. That is, suction nozzle 332 is able to be pivoted to and from a non-pivoted position and a pivoted position by operation of nozzle pivoting device 334. Further, nozzle rotating device 335 rotates suction nozzle 332 around its own center axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 10:
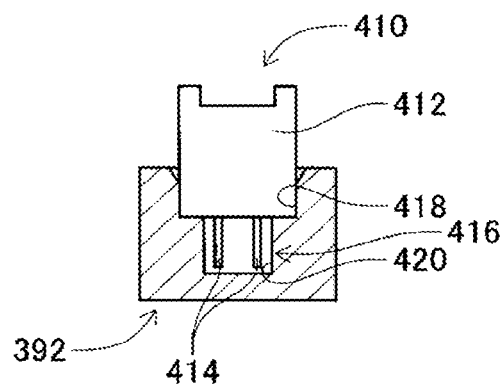
FIG. 10 shows a component receiving member in which is stored a leaded component.

In detail, as shown in FIG. 10, components supplied by loose component supply device 32 are electronic circuit components 410 that have leads (hereinafter also referred to as "leaded components"), being configured from a block-like component main body 412, and two leads 414 that protrude from the bottom surface of component main body 412. Also, component reception recess 416 is formed in component receiving member 392. Component reception recess 416 is a stepped recess configured from main body section reception recess 418 open at the top surface of component receiving member 392, and lead reception recess 420 open at the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 and extending in the front-rear direction. Component carrier 388 is provided on the upper surface of component carrier moving device 390 to be slidable in the front-rear direction, and is slid to any position in the front-rear direction by operation of electromagnetic motor 430 (refer to FIG. 11). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 11:
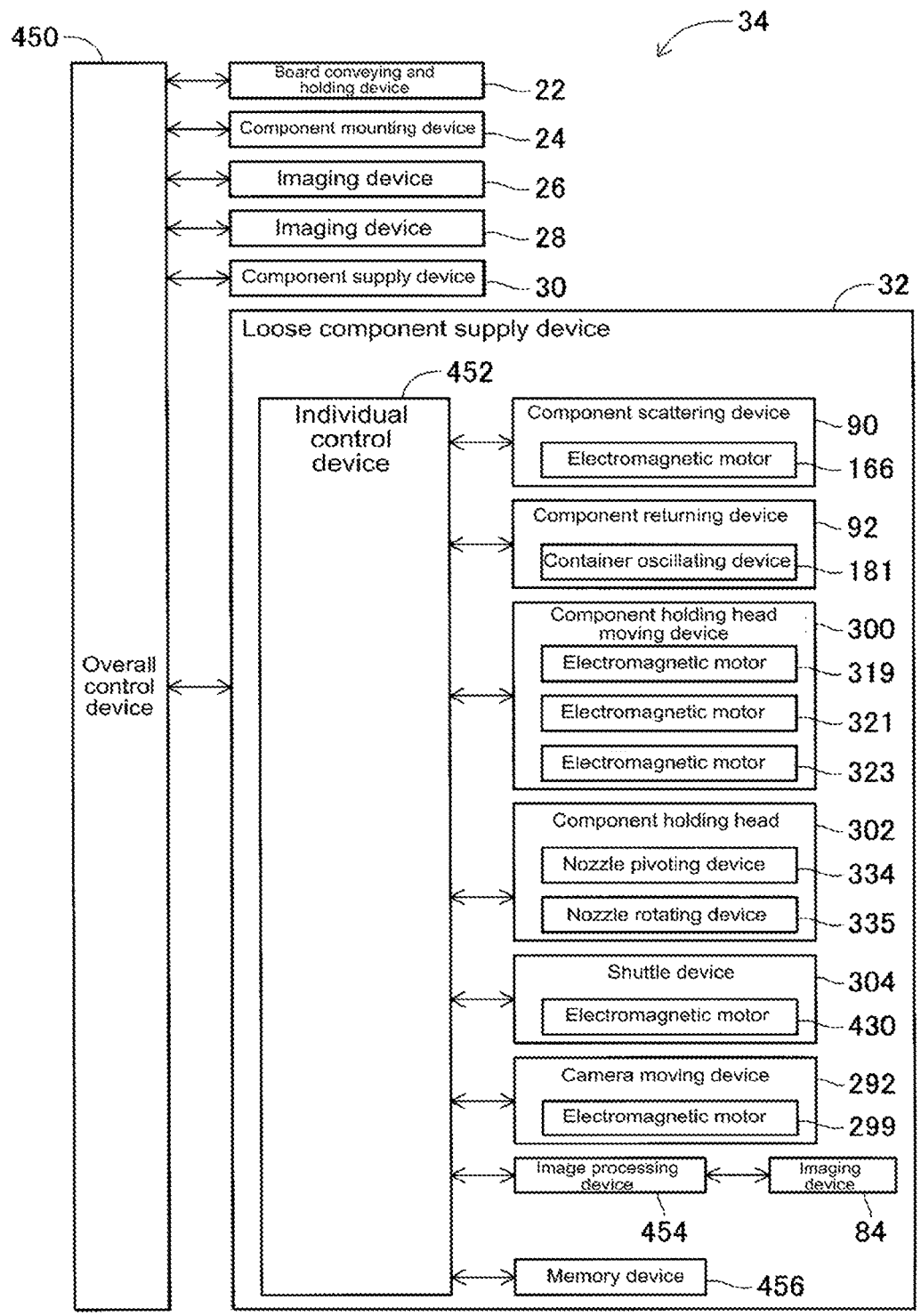
FIG. 11 is a block diagram showing a control device of the component mounter.

Further, as shown in FIG. 11, control device 34 includes overall control device 450, multiple individual control devices (only one is shown in the FIG. 452, image processing device 454, and memory device 456. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown). Individual control device 452 of loose component supply device 32 is connected to component scattering device 90, component returning device 92, camera moving device 292, component holding head moving device 300, component holding head 302, and shuttle device 304. Individual control device 452 of loose component supply device 32 controls component scattering device 90, component returning device 92, camera moving device 292, component holding head moving device 300, component holding head 302, and shuttle device 304.

Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84. Also, memory device 456 memorizes various types of data and is connected to individual control device 452. By this, individual control device 452 acquires various types of data from memory device 456.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

Loose Component Supply Device Operation (a) Supply of leaded components using loose component supply device With loose component supply device 32, leaded components 410 are inserted by an operator into insertion opening 97 of component supply apparatus 88, then the inserted leaded components 410 are supplied in a state loaded on component receiving member 392 of component carrier 388 by operation of component supply unit 82 and component transfer device 86. In detail, the operator inserts leaded components 410 via insertion opening 97 at the top of component supply apparatus 88. Here, component supporting member 150 is moved below component supply apparatus 88 by operation of component support member moving device 152 to be in a stored state (refer to FIG. 6). With component support member 150 in a stored state, component collection container 180 positioned at the front end of component support member 150 is positioned in front of component supply apparatus 88, and the opening of component collection container 180 is oriented facing up (collection orientation).

Figure 6:
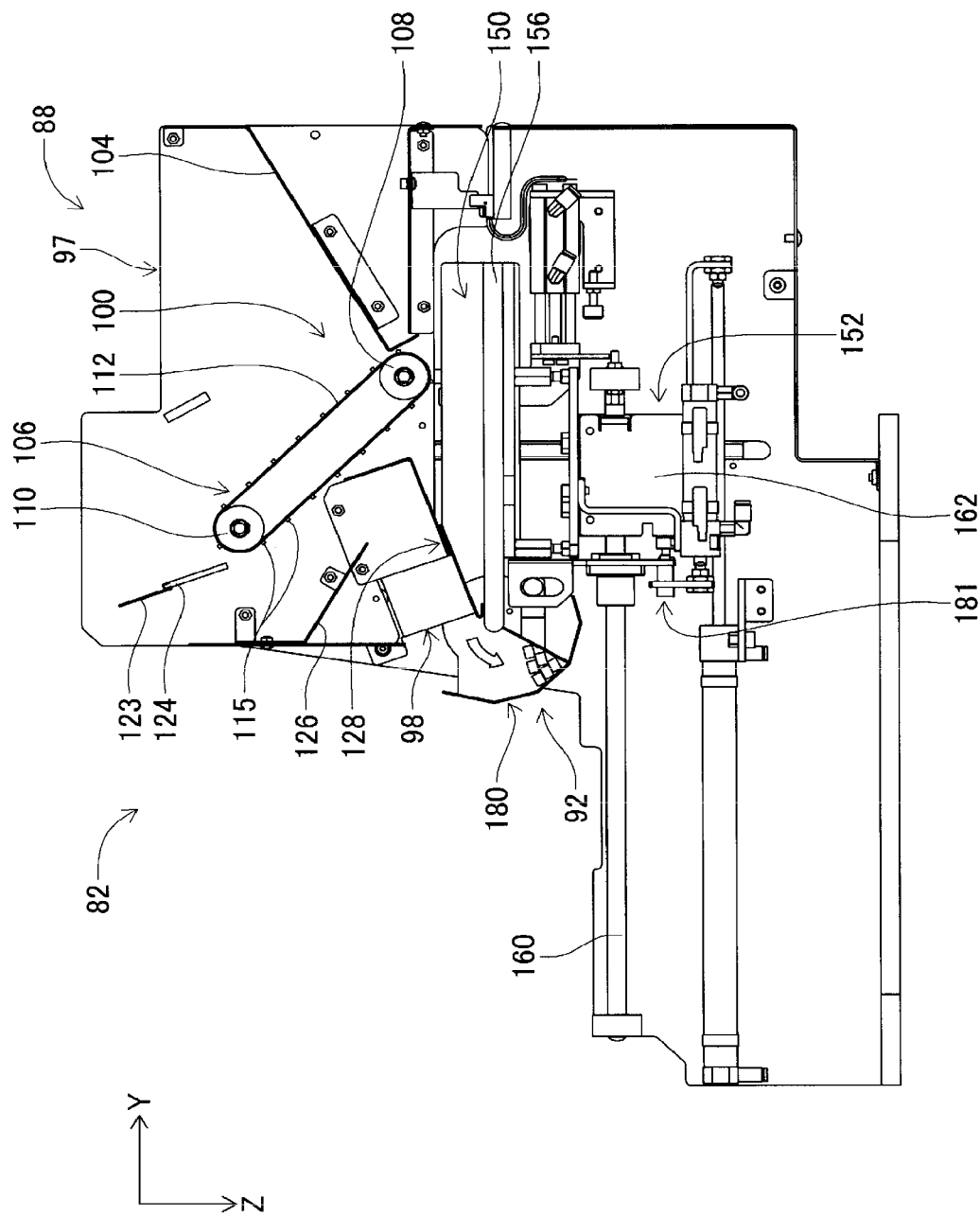
FIG. 6 is a cross section view of the component supply unit.

Leaded components 410 inserted via insertion opening 97 on the top surface of component storage apparatus 88 fall onto inclined plate 104 of component storage apparatus 88 and roll down to the front lower end of inclined plate 104. Here, leaded components 410 that have rolled down to the front bottom end of inclined plate 104 pile up between the front bottom end of inclined plate 104 and the rear bottom end of conveyor device 106. In other words, between the lower front end of inclined plate 104 and the lower rear end of conveyor device 106 functions as housing section 100 for housing leaded components 410. Then, when rotation device 116 of conveyor device 106 is operated, conveyor belt 112 of conveyor device 106 is rotated counterclockwise as shown in FIG. 6. By this, leaded components 410 piled up in housing section 100 are conveyed by conveyor belt 112 diagonally up and forward.

Then, leaded components 410 conveyed diagonally up by conveyor belt 112 pass between the upper end on the front side of conveyance device 106 and brush 124 and fall onto inclined plate 120 provided below the upper end on the front side of conveyance device 106 and brush 124. Leaded components 410 that have fallen onto inclined plate 126 roll towards the rear of inclined plate 126 onto inclined plate 128 provided below inclined plate 126. Then, leaded components 410 that have fallen onto inclined plate 128 roll towards the front and are discharged from discharge opening 98 at the front of component supply apparatus 88. In this manner, leaded components 410 that have fallen from the front end of conveyor device 106 fall onto inclined plate 126 and then onto inclined plate 128. That is, leaded components 410 are discharged from discharge opening 98 of component supply apparatus 88. By this, damage to leaded components 410 due to falling is reduced.

Component support member 150 is moved towards the front from under component supply apparatus 88 due to operation of component supply member moving device 152 at the time that leaded components 410 are discharged from discharge opening 98 of component supply apparatus 88. By this, leaded components 410 discharged from discharge opening 98 of component supply apparatus 88 are discharged onto the upper surface of stage 156 of component support member 150.

Leaded components 410 that have been discharged onto stage 156 from component supply apparatus 88 roll forward, though even if they roll and fall from the front of stage 156 they are stored in component collection container 180. Also, if leaded components 410 that have been discharged onto stage 156 from component supply apparatus 88 roll sideways, they are prevented from falling from stage 156 by side walls 158 of component support member 150.

Then, component support member 150 is moved forwards from the stored state to the exposed state and then movement of component support member 150 is stopped. By this, leaded components 410 are scattered across the entire upper surface of stage 156. With component supply apparatus 88, operation of conveyor device 106 is stopped to match the timing of the stopping of the operation of component support member 150 such that leaded components 410 are discharged finally from component supply apparatus 88.

Figure 12:
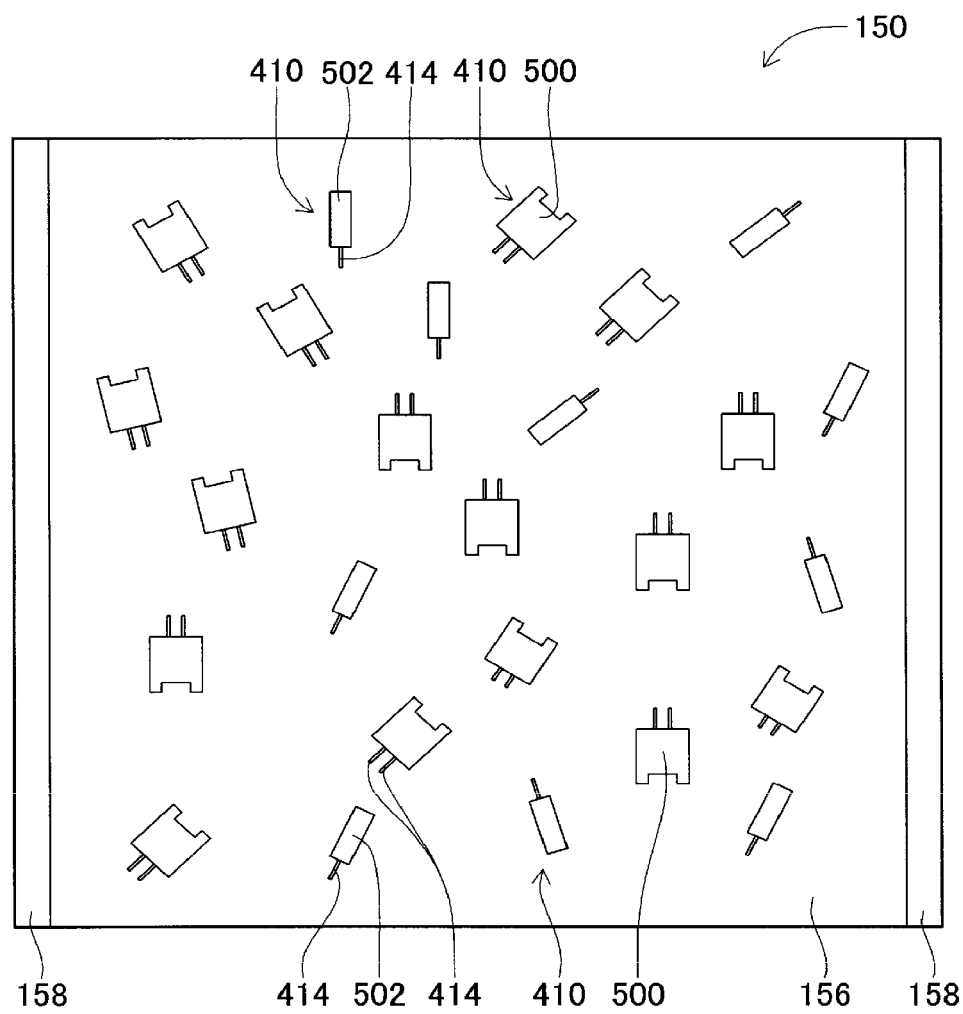
FIG. 12 shows leaded components scattered on a stage.

Note that, when leaded components 410 are scattered on stage 156 of component support member 150 from component storage apparatus 88, as shown in FIG. 12, leaded components 410 are scattered on stage 156 in largely two orientations. Specifically, leaded components 410 are scattered on stage 156 in the following two orientations: an orientation in which the two leads 414 are in a state approximately lined up in a horizontal direction (also referred to as a "first orientation"), and an orientation in which the two leads 414 are in a state approximately lined up in a vertical direction (also referred to as a "second orientation").

When leaded components 410 are scattered on stage 156 as above, camera 290 of imaging device 84, by operation of camera moving device 292, moves above component support member 150 and images leaded components 410. Then, based on the image data imaged by camera 290, a leaded component that is a target for pickup (also referred to as "pickup target component") is identified by pattern matching.

Specifically, shape imaging data (also referred to as "first orientation component imaging data") created in accordance with an outline of a leaded component 410 in a first orientation is memorized on memory device 456 and analysis is performed by individual control device 452 to determine whether the first orientation imaging data is included in imaging data of the stage captured by camera 290. Gradation values, brightness, and color levels for each of R, G, and B are included as data values in imaging data captured by camera 290, then it is analyzed whether the first orientation component imaging data is included in the imaging data based on these data values.

When the first orientation component data is included in the imaging data captured by camera 290, based on an image based on the first orientation component imaging data, that is, based on an image of an outline of a leaded component 410 in the first orientation, the position and direction of the leaded component 410 in the first orientation on stage 156 are calculated, and that leaded component 410 in the first orientation is identified as a pickup target component. This is because, for leaded components 410 in the first orientation, side surface 500 with a large surface area is facing upwards, and it is possible to hold side surface 500 with suction nozzle 332, but for leaded components 410 in the second orientation, side surface 502 with a small surface area is facing upwards, and it is not possible to hold side surface 502 using suction nozzle 332.

Figure 13:
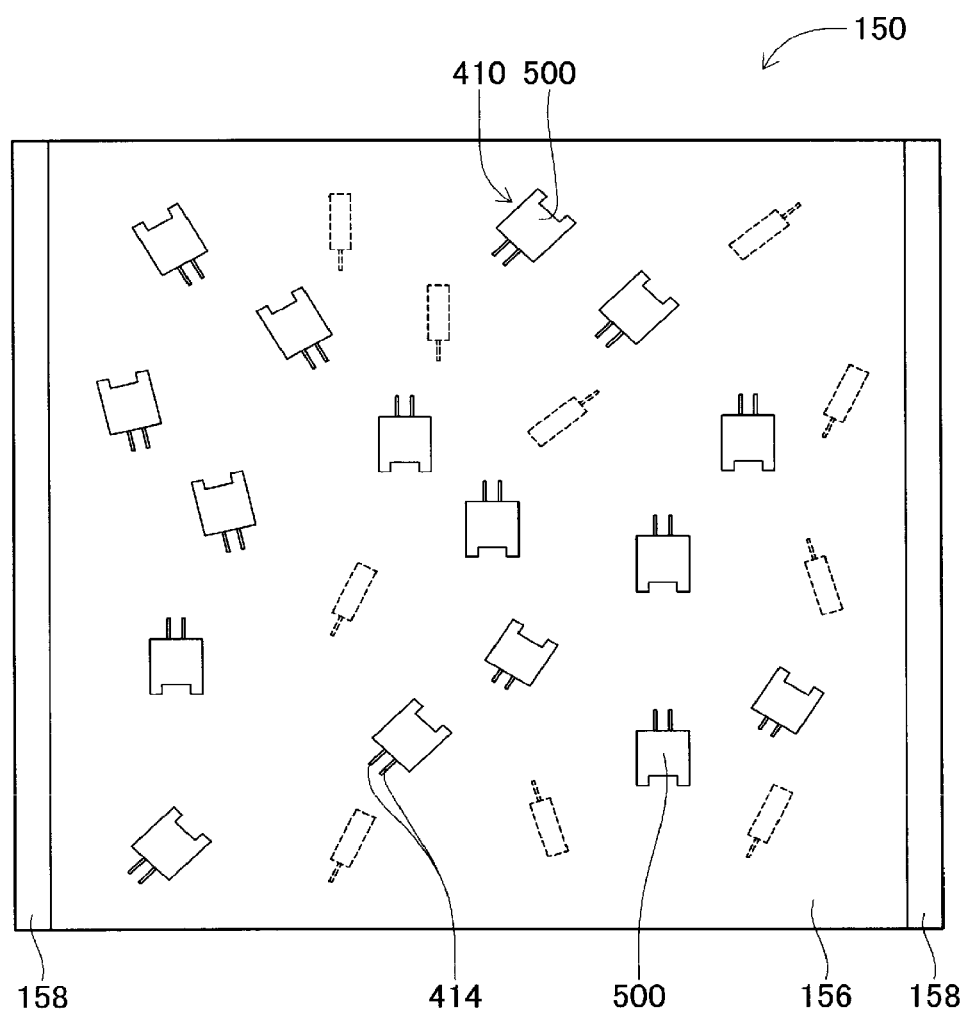
FIG. 13 shows a leaded component to be recognized by pattern matching.

Note that, because shape imaging data created in accordance with an outline of a leaded component 410 in a second orientation is not memorized in memory device 456, when analyzing the imaging data using pattern matching, a leaded component 410 in the second orientation is not recognized. Therefore, when creating an image from the analysis results based on pattern matching on the imaging data, as shown in FIG. 13, only leaded components in the first orientation are recognized, leaded components 410 in the second orientation are not recognized. That is, with the analysis on the imaging data using pattern matching, the position and direction and the like of a leaded component 410 in the first orientation can be appropriately recognized, the presence of a leaded component 410 in the second orientation may not be recognized. In FIG. 13, leaded components 410 that are not recognized are shown by dashed lines.

Then, when a leaded component 410 in the first orientation has been identified as a pickup target component, that pickup target component is picked up and held by suction nozzle 332. Note that, when the pickup target component is picked up and held by suction nozzle 332, suction nozzle 332 is in the non-pivoted position. Then, after holding leaded component 410 using suction nozzle 332, component holding head 302 is moved above component carrier 388. Then, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the leaded component 410 held by suction nozzle 332 that is in the pivoted position face downwards in a vertical direction.

When component holding head 302 is moved above component carrier 388, leaded component 410 in a state with leads 414 facing downwards in the vertical direction is inserted into component reception recess 416 of component reception member 392. By this, as shown in FIG. 10, leaded component 410 is loaded in component receiving member 392 with leads 414 facing vertically downwards.

Also, when leaded component 410 is loaded on component receiving members 392, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In this manner, with loose component supply device 32, leaded components 410 are supplied with leads 414 pointing downwards, and with the upper surface that is opposite tp the bottom surface to which leads 414 are connected facing upwards. Therefore, suction nozzle 66 of work head 60 or 62 is able to appropriately hold leaded component 410.

When a pickup target component is picked up from stage 156 of component support member 150, the position and the like of leaded components 410 remaining on stage 156 may change. Therefore, when a pickup target component has been picked up from stage 156, analysis is performed on the imaging data using pattern matching, and the position, direction, and so on of the pickup target components are calculated. In other words, each time a pickup target component is picked up from stage 156, analysis is performed on the imaging data using pattern matching. Thus, it is possible to pick up the pickup target component using suction nozzle 332 based on an appropriate position and the like of the pickup target component.

(b) Collection and Replenishment of Leaded Components

With loose component supply device 32, when it is determined that pickup target components are present on stage 156 of component support member 150 based on the analysis of the imaging data by pattern matching, pickup of the pickup target components is repeated and the picked up pickup target components are loaded on component receiving member 392. Then, by component carrier 388 mounted on component receiving member 392 being moved to the component supply position, supply of leaded components 410 is performed. However, if it is determined that pickup target components are not present on stage 156 of component support member 150 based on the analysis of the imaging data by pattern matching, that is, all leaded components 410 in the first orientation that can be picked up have been picked up, and only leaded components 410 in the second orientation or the like, which cannot be picked up, are present on stage 156, leaded components 410 cannot be picked up from stage 156.

Thus, with loose component supply device 32, in such a case, leaded components 410 remaining on stage 156 are collected in component collection container 180. Then, leaded components 410 collected into component collection container 18 are scattered again onto stage 156, and by doing so the orientation of the leaded components 410 changes such that pickup of leaded components 410 from stage 156 can be restarted. However, if the quantity of leaded components 410 collected in component collection container 180 is small, it is possible that the quantity of pickup target components on stage 156 will be too small even though leaded components collected in component collection container 180 have been re-scattered onto stage 156. Therefore, in such a case, it is desirable that not only are leaded components 410 collected in component collection container 180 re-scattered, but that leaded components 410 are replenished from component supply apparatus 88. That is, it is desirable that leaded components 410 from both component collection container 180 and component supply apparatus be replenished onto stage 156. However, if there many leaded components 410 collected by component collection container 180 and leaded components 410 are replenished on stage 156 from both component collection container 180 and component supply apparatus 88, the quantity of leaded components 410 replenished on stage 156 will become even larger. In such a case, leaded components 410 replenished on stage 156 will pile up, and it may not be possible to perform appropriate pickup of leaded components 410. Therefore, it is necessary to estimate the quantity of leaded components 410 collected by component collection container 180, that is, the quantity of leaded components 410 remaining on stage 156 before leaded components 410 are collected in component collection container 180.

Figure 14:
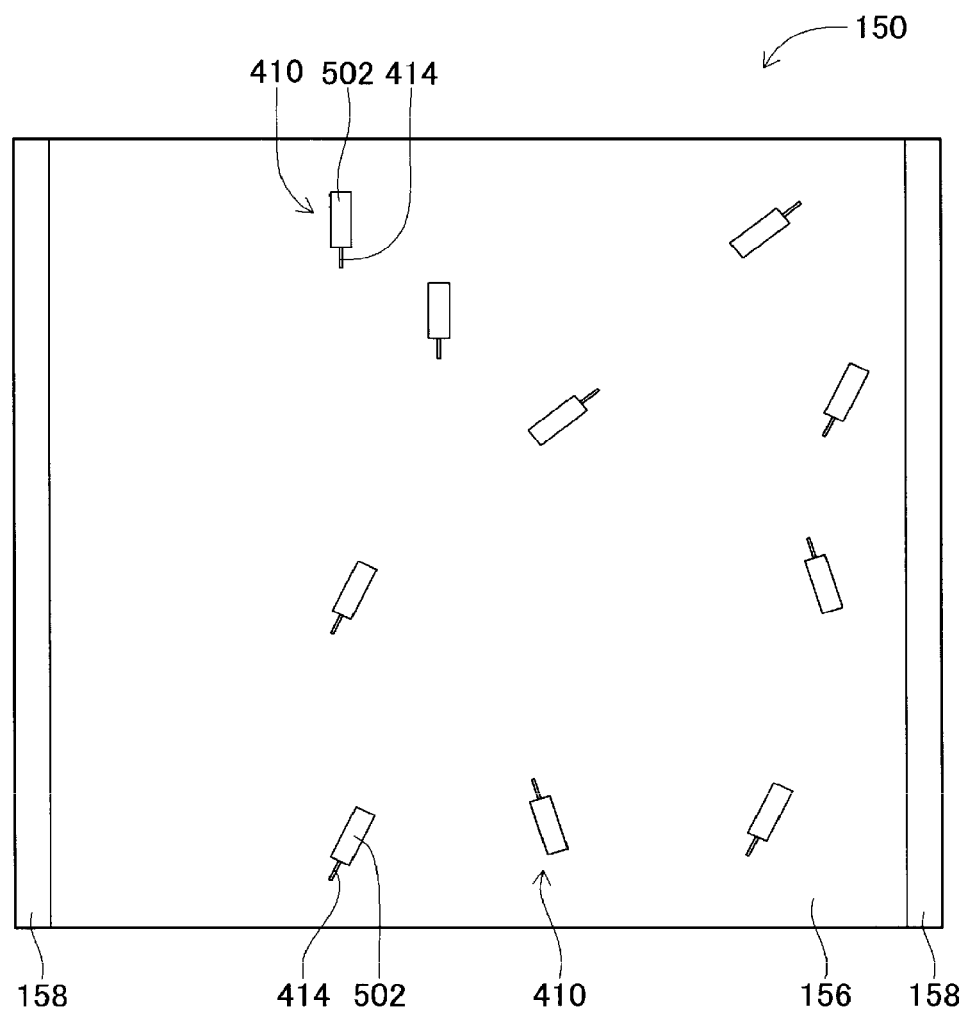
FIG. 14 shows leaded components scattered on a stage.

However, as described above, by analyzing the imaging data of stage 156 captured by camera 290 using pattern matching, although the position, direction, and the like of leaded components 410 in the first orientation can be appropriately recognized, the presence of leaded components 410 in the second orientation may not be recognized. Therefore, it is not possible to estimate the quantity of leaded components 410 remaining on stage 156. For example, is a case in which all the leaded components 410 in the first orientation that can be picked up are picked up before leaded components 410 on stage 156 are collected by component collection container 180, as shown in FIG. 14, only leaded components 410 remain on stage 156. In such a case, the presence of leaded component s 410 may not be recognized by analyzing the imaging data of stage 156 using pattern matching, and it is not possible to estimate the quantity of leaded components 410 remaining on stage 156.

Considering this point, with loose component supply device 32, imaging data of stage 156 captured by camera 290 is analyzed not only by pattern matching, but also by another method to estimate the quantity of leaded components 410 remaining on stage 156. Specifically, imaging data of stage 156 without any leaded components 410 scattered on stage 156 (also referred to as "pre-scattering imaging data") is memorized on memory device 456. That is, before any leaded components 410 are scattered on stage 156, stage 156 is imaged by camera 290, and the imaging data is memorized on memory device 456. In the pre-scattering imaging data, the region of stage 156 that is captured is divided into 20×20 blocks in the X and Y directions, and average values for the brightness, color level, and the like for each block included in the imaging data of stage 156 before any leaded components 410 are scattered are calculated.

Then, after leaded components 410 have been scattered on stage 156, each time stage 156 is imaged by camera 290, the imaging data from that imaging (also referred to as "post-scattering imaging data") and the pre-scattering imaging data memorized on memory device 456 are compared. In detail, similar to with the pre-scattering imaging data, for the post-scattering imaging data the region of the stage 156 that is captured is divided into 20×20 blocks in the X and Y directions, and average values for the brightness, color level, and the like for each block included in the imaging data of stage 156 after leaded components 410 are scattered are calculated. Then, for each block, a brightness difference between the pre-scattering imaging data and the post-scattering imaging data is calculated, and a color difference between the pre-scattering imaging data and the post-scattering imaging data is calculated. The color difference between the pre-scattering imaging data and the post-scattering imaging data may be calculated, for example, using CIELAB color space.

Here, a block for which the brightness difference between the pre-scattering imaging data and the post-scattering imaging data is equal to or greater than a first threshold value is determined to be a block with a leaded component 410. That is, for a block for which the brightness difference between imaging data for which it is known that no leaded components 410 are present (pre-scattering imaging data) and imaging data for which it is unknown whether a leaded component 410 is present (post-scattering imaging data) is equal to or greater than the first threshold value, because it is reasonable to assume that something is present causing the brightness difference, it is determined that a leaded component 410 is present in the block.

Also, a block for which the color difference between the pre-scattering imaging data and the post-scattering imaging data is equal to or greater than a second threshold value is determined to be a block with a leaded component 410. That is, for a block for which the color difference between imaging data for which it is obvious that no leaded components 410 are present (pre-scattering imaging data) and imaging data for which it is unknown whether a leaded component 410 is present (post-scattering imaging data) is equal to or greater than the second threshold value, because it is reasonable to assume that something is present causing the color difference, it is determined that a leaded component 410 is present in the block.

Thus, it is determined that blocks for which the brightness difference is equal to or greater than the first threshold value and blocks for which the color difference is equal to or greater than the second threshold value are blocks with a leaded component 410. That is, it is determined that a leaded component 410 is present in a block for which at least one of the following is true: a brightness difference between the pre-scattering imaging data and the post-scattering imaging data is equal to or greater than the first threshold value; and a color difference between the pre-scattering imaging data and the post-scattering imaging data is equal to or greater than the second threshold value. In this manner, it is possible to appropriately determine whether a leaded component 410 is present in each block using values that represent two types of optical characteristics, that is, brightness and color level.

Figure 15:
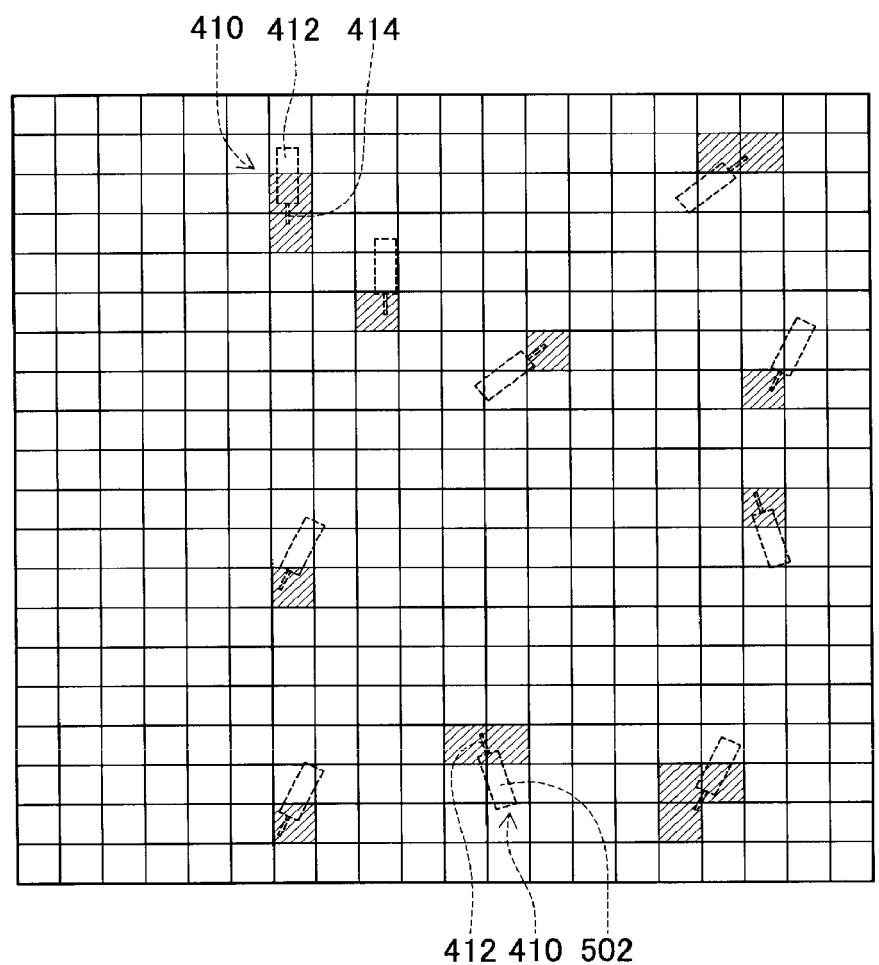
FIG. 15 shows a determination result for determining the presence of components based on a brightness difference between the imaging data.

Specifically, depending on the shape and orientation of a leaded component 410, the color and material of component main body 412 and leads 414 of leaded component 410, the color and material of stage 156, and the like, there are cases in which the brightness difference and the color difference between the pre-scattering imaging data and the post-scattering imaging data is small even if there is a leaded component 410 in the block. For example, in FIG. 15, blocks for which the brightness difference between the pre-scattering imaging data and the post-scattering imaging data is equal to or greater than the first threshold value are shown by the shaded areas. In the figure, in blocks in which a lead 414 of a leaded component 410 is present, the brightness difference is equal to or greater than the first threshold value, but for blocks in which component main body 412 of a leaded component 410 is present, the brightness difference is not equal to or greater than the first threshold value. In other words, due to the relationships between the colors, materials, and the like of component main body 412 of leaded component 410 and the color, material, and the like of stage 156, the brightness difference between component main body 412 and stage 156 is small, so it is difficult to determine whether component main body 412 is present. On the other hand, the brightness difference between leads 414 and stage 156 is large, so it is easy to determine whether a lead 414 is present. In this manner, when it is determined that there is a leaded component 410 present based on the brightness difference between the pre-scattering imaging data and the post-scattering image data, it is possible to appropriately determine the presence of leads 414, but not to appropriately determine the presence of component main body 412.

Figure 16:
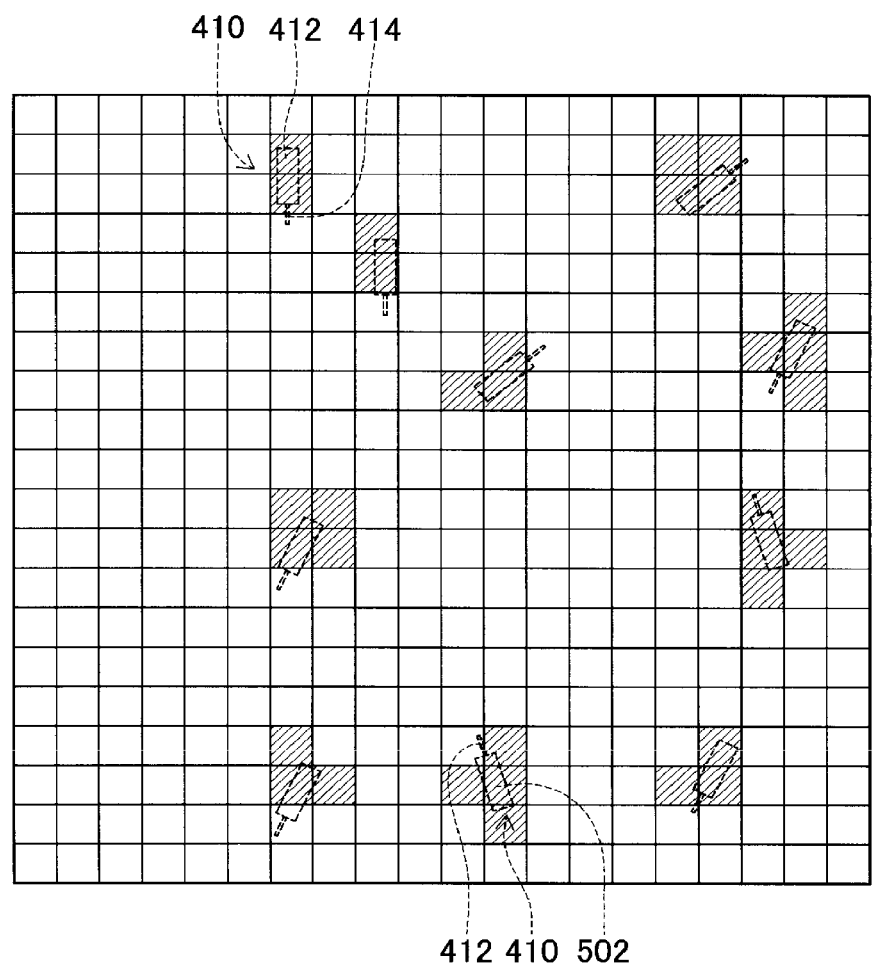
FIG. 16 shows a determination result for determining the presence of components based on a color difference between the imaging data.

Further, for example, in FIG. 16, blocks for which the color difference between the pre-scattering imaging data and the post-scattering imaging data is equal to or greater than the second threshold value are shown by the shaded areas. In the figure, in blocks in which component main body 412 of a leaded component 410 is present, the color difference is equal to or greater than the second threshold value, but for blocks in which a lead 414 of a leaded component 410 is present, the color difference is not equal to or greater than the second threshold value. In other words, due to the relationships between the colors, materials, and the like of leads 414 of leaded component 410 and the color, material, and the like of stage 156, the color difference between component main body 412 and stage 156 is small, so it is difficult to determine whether a lead 414 is present. On the other hand, the color difference between component main body 412 and stage 156 is large, so it is easy to determine whether a component main body 412 is present. In this manner, when it is determined that there is a leaded component 410 present based on the color difference between the pre-scattering imaging data and the post-scattering image data, it is possible to appropriately determine the presence of component main body 412, but not to appropriately determine the presence of leads 414.

Figure 17:
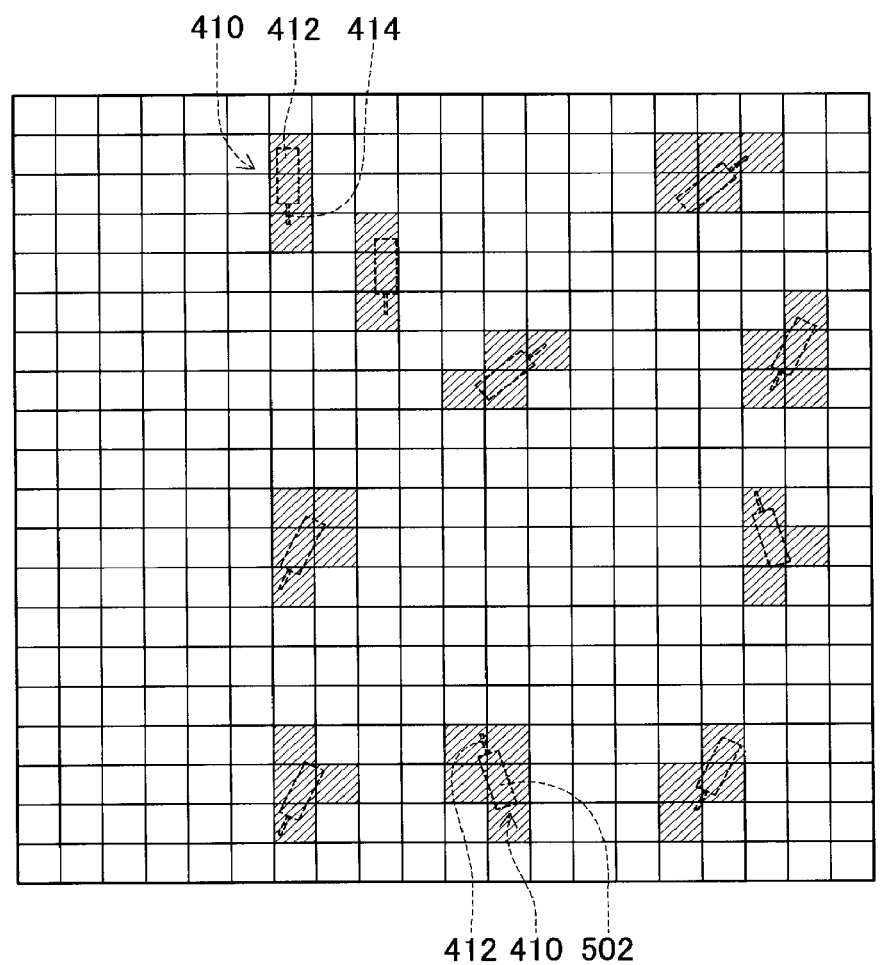
FIG. 17 shows a determination result for determining the presence of components based on a brightness difference and a color difference between the imaging data.

Considering the above, in the example shown in FIG. 17, blocks for which the brightness difference between the pre-scattering imaging data and the post-scattering imaging data is equal to or greater than the first threshold value and blocks for which the color difference between the pre-scattering imaging data and the post-scattering imaging data is equal to or greater than the second threshold value are shown by the shaded areas. As is clear from the figure, by determining the presence of leaded components 410 using both the brightness difference and the color difference, it is possible to appropriately determine the presence of leaded components 410 for all blocks.

In this manner, because it possible to appropriately determine the presence of leaded components 410 in all blocks, it is possible to estimate the quantity of leaded components 410 remaining on stage 156. Specifically, for example, when one leaded component 410 is scattered on stage 156, the quantity of blocks occupied by that leaded component 410 (also referred to as "component-occupation block quantity") is calculated based on data representing the size of the leaded component 410 (also referred to as "component size data"). Thus, it is possible to estimate the quantity of leaded components 410 present on stage 156 by dividing the total quantity of blocks determined to have a leaded component 410 (also referred to as "component-present block quantity") by the "component-occupation block quantity".

When a quantity of leaded components 410 exceeding specified quantity N is present on stage 156, it is not necessary to supply leaded components 410 onto stage 156 from component supply apparatus 88, and when a quantity of leaded components equal to or less than specified quantity N is present on stage 156, it is necessary to supply leaded components 410 onto stage 156 from component supply apparatus 88. If the component-occupation block quantity M of specified quantity N of leaded components 410 is taken as set quantity X, and the component-present block quantity is equal to or less than set quantity X, leaded components 410 are supplied from component supply apparatus 88, and when the component-present block quantity exceeds set quantity X, leaded components 410 are not supplied from component supply apparatus 88.

Specifically, for example, if specified quantity N is 10, and component-occupation block quantity M is 4.5, set quantity X is 45 (=10×4.5). When the component-present block quantity is 45 or fewer, leaded components 410 are supplied from component supply apparatus 88, and when the component-present block quantity exceeds the set quantity of 45, leaded components 410 are not required to be supplied from component supply apparatus 88. Thus, the quantity of leaded components 410 present on stage 156 can be estimated, and leaded components 410 can be replenished from component supply apparatus 88 at an appropriate time.

However, set quantity X increases as the component-occupation block quantity increases. That is, as the size of the leaded components 410 increases, the component-occupation block quantity increases and the set quantity X increases. Therefore, for example, for a leaded component 410 with a large size, when set quantity X is calculated using the method outlined above, set quantity X may be 200 or greater. In such a case, leaded components 410 are supplied onto stage 156 from component supply apparatus 88 in around half the stage occupied by large leaded components 410. In other words, for example, when set quantity X is set to 200, if the component-present block quantity is 200, leaded components 410 are supplied onto stage 156 from component supply apparatus 88. Because stage 156 is divided into 20×20 (=400) blocks, when the component-present block quantity is 200, leaded components occupy about half (200) of the regions (400) of stage 156. If leaded components 410 are supplied onto stage 156 from component supply apparatus 88 in this state, the leaded components 410 will pile up on each other, and it will be difficult to appropriately pick up the leaded components 410. Considering this, the upper limit of set quantity X is set to less than 200, specifically, 150. In other words, even if the set quantity X calculated using the procedure above exceeds 150, the set quantity X is set to 150. Then, if the component-present block quantity exceeds 150, leaded components 410 are supplied from component supply apparatus 88, and if the component-present block quantity is equal to or less than the set quantity 150, leaded components 410 are not supplied from component supply apparatus 88.

According to the above procedure, when it is determined that the component-present block quantity is equal to or less than the set quantity, leaded components 410 are replenished onto stage 156 from both component collection container 180 and component supply apparatus 88. In detail, first, component support member 150 is moved below component supply apparatus 88 by operation of component support member moving device 152. That is, component support member 150 is moved from the exposed state (refer to FIG. 5) towards the stored state (refer to FIG. 6). Here, component collection container 180 provided at the front end of component support member 150 is oriented such that the opening is facing up, that is, component support member 150 is in the collection orientation. Then, when component support member 150 is moved from the exposed state towards the stored state, leaded components 410 are discharged onto stage 156 of component support member 150 from component supply apparatus 88. Note that, because the discharge of leaded components 410 from component supply apparatus 88 is performed in the same manner to the procedure described above, descriptions are omitted here.

Figure 18:
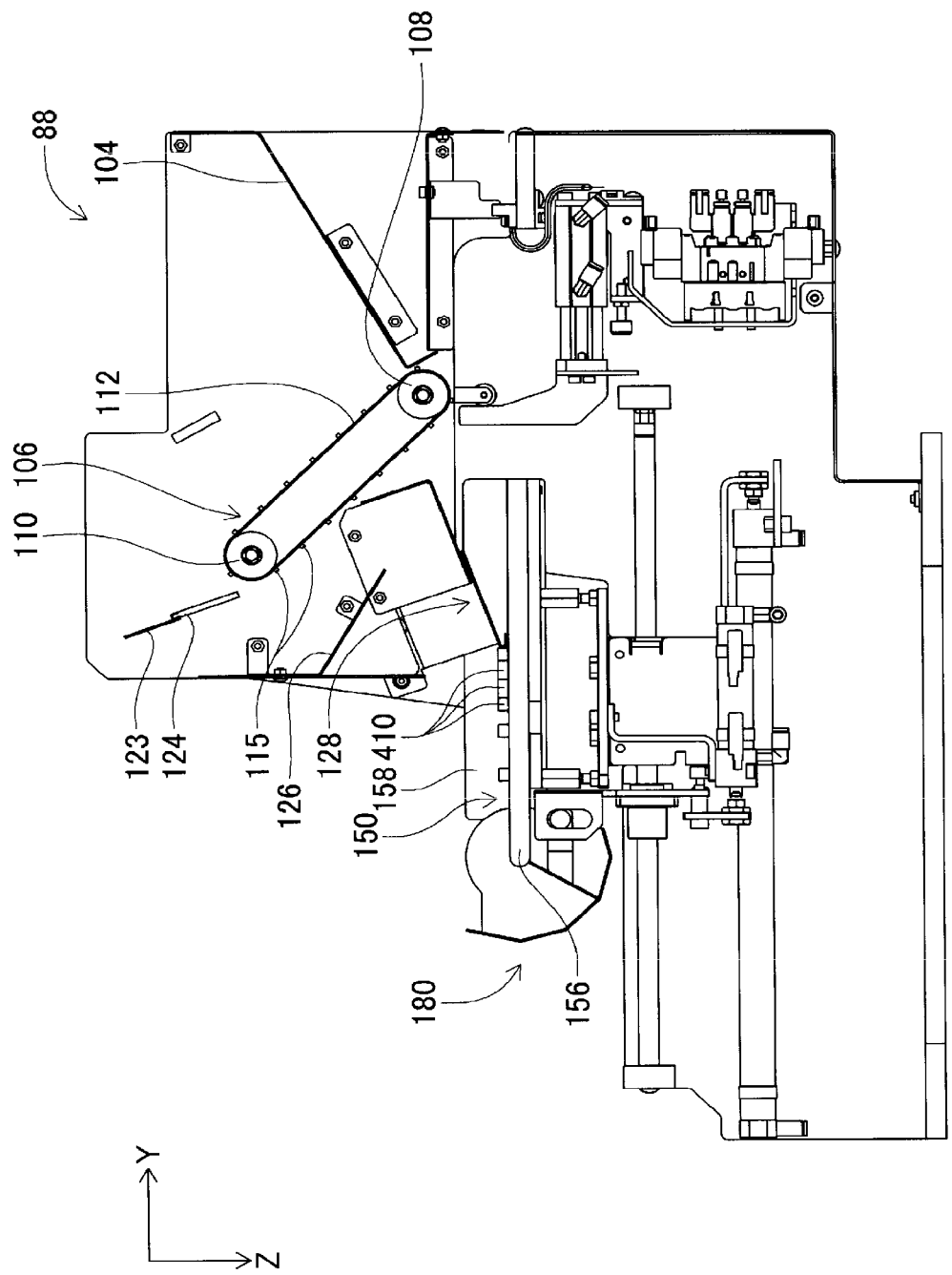
FIG. 18 is a cross section view of the component supply unit.

After the discharging of leaded components 410 from component supply apparatus 88, on stage 156 there are leaded components 410 that remained on stage 156 from before the discharging of leaded components 410 from component supply apparatus 88 and there are leaded components 410 newly discharged from component supply apparatus 88. Note that, also when leaded components 410 are discharged from component supply apparatus 88, component support member 150 moves towards the stored state. Therefore, as shown in FIG. 18, leaded components 410 on stage 156 of component support member 150 are stopped by the front end of inclined plate 128 of component supply apparatus 88 in accordance with the movement of component support member 150. Further, as shown in FIG. 6, when component support member 150 reaches the stored state, leaded components 410 on stage 156 fall inside component collection container 180. By this, leaded components 410 remaining on stage 156 are collected in component collection container 180. In other words, leaded components 410 discharged from component supply apparatus 88 when component support member 150 was moving towards the stored state and leaded components 410 remaining on stage 156 from before the leaded components 410 were discharged from component supply apparatus 88 are collected in component collection container 180.

Continuing, when leaded components 410 are collected in component collection container 180, those leaded components 410 are replenished onto stage 156. In detail, when collection of leaded components 410 into component collection container 180 is complete, as shown in FIG. 6, component support member 150 is in the stored state. Therefore, component support member 150 is moved from the stored state towards the front by the operation of component support member moving device 152. Also, when component support member 150 has been moved forward from the stored state by a specified amount, container swinging device 181 of component returning device 92 is operated and component collection container 180 is swung. Note that, when component collection container 180 is swung, the specified amount that component support member 150 is moved forward from the stored state is set in advance, with a specified area of stage 156 to which replenishment of leaded components 410 from component collection container 180 is to occur set as the movement quantity of component support member 150 when being exposed from below component supply apparatus 88. Also, movement of component support member 150 does not stop even when component collection container 180 swings. That is, component collection apparatus 180 swings while component support member 150 is moving.

Here, the orientation of component collection container 180 changes from an orientation with the opening facing up (collection orientation) to an orientation with the opening facing stage 156 (returning orientation) by the swinging of component collection container 180. By this, leaded components 410 collected in component collection container 180 are replenished onto stage 156 in a scattered state. Note that, as described above, when component collection container 180 is swung, component support member 150 also moves, and when reaching the exposed state, movement of component support member 150 is stopped. Also, after leaded components 410 have been scattered on stage 156 from component collection container 180, the orientation of component collection container 180 returns from the orientation with the opening facing stage 156 (returning orientation) to the orientation with the opening facing up (collection orientation). Thus, by scattering leaded components 410 on stage 156 from component collection container 180, the orientation of the leaded components 410 is changed, and leaded components 410 in the first orientation are picked up again from stage 156.

Also, according to the above procedure, when it is determined that the component-present block quantity exceeds the set quantity, leaded components 410 are replenished onto stage 156 from only component collection container 180. In detail, in the same manner as when leaded components 410 are replenished from both component collection container 180 and component supply apparatus 88, first, component support member 150 is moved from the exposed state towards the stored state. However, leaded components 410 are not replenished from component supply apparatus 88. Leaded components 410 on stage 156 are stopped by the front end of inclined plate 122 of component supply apparatus 88 in accordance with the movement of component support member 150. Further, by moving component support member 150 to the stored state, leaded components 410 on stage 156 fall inside component collection container 180. By this, leaded components 410 remaining on stage 156 are collected in component collection container 180. Here, for component collection container 180, only leaded components 410 remaining on stage 156 after pick up from stage 156 are collected in component collection container 180. When component support member 150 reaches the stored state, component support member 15 is moved again towards the exposed state. In this case, component collection container 180 is swung based on the following procedure. By this, leaded components 410 collected in component collection container 180 are replenished onto stage 156.

In this manner, with loose component supply device 32, leaded components 410 are replenished onto stage 156 from both component collection container 180 and component supply apparatus 88 or from only component collection container 180, in accordance with the quantity of leaded components 410 remaining on stage 156. When leaded components 410 are replenished onto stage 156 from both component collection container 180 and component supply apparatus 88 or from only component collection container 180, the leaded components 410 replenished onto stage 156 are imaged by camera 290 of imaging device 84, and based on the image data captured by camera 290, pickup target component are identified again. Then, the identified pickup target components are picked up and held by suction nozzle 332 and, according to a procedure described above, supply of the leaded components 410 is performed by loose component supply device 32.

In this manner, with loose component supply device 32, by determining whether to supply components onto 156 from component supply apparatus 88 based on imaging data from camera 290, it is possible to supply components onto stage 156 from component supply apparatus 88 with appropriate timing, such that an appropriate quantity of components is scattered on stage 156. Further, to determine the timing of supply of components from component supply apparatus 88, stage 156 imaged by camera 290 is divided into a specified quantity of blocks, with the presence of components being determined for each block. This shortens the time required for determination. In detail, when stage 156 imaged by camera 290 is not divided into a specified quantity of blocks, for example, it is necessary to determine the presence of components in all the pixels of camera 290. On the other hand, when stage 156 imaged by camera 290 is divided into a specified quantity of blocks, it is only necessary to determine the presence of components with respect to each of the specified quantity of blocks. Therefore, by dividing stage 156 imaged by camera 290 into a specified quantity of blocks and determining the presence of components in each of the blocks, it is possible to reduce the time required for determining.

Note that, loose component supply device 32 is an example of a component supply system. Imaging device 84 is an example of an imaging device. Component supply apparatus 88 is an example of a replenishing device. Stage 156 is an example of a stage. Individual control device 452 is an example of a determining device. Pre-scattering imaging data is an example of first imaging data. Post-scattering imaging data is an example of second imaging data.

Further, the present disclosure is not limited to the above example embodiments, and various changed or improved methods of embodiment are possible based on the knowledge of someone skilled in the art. Specifically, for example, in an embodiment above, the presence of a component in each block is determined based on both a brightness difference and a color difference of the imaging data, but the presence of a component in each block may be determined based on either a brightness difference or a color difference of the imaging data. In particular, because it is possible to determine the presence of a component in each block in around 90% of cases using color difference, it is desirable to use color difference. Note that, in addition to brightness difference and color difference, it is possible to use a difference of a value indicating a variety of optical characteristics, such as saturation, hew, or reflectance, for determining the presence of a component in each block.

Also, in an embodiment above, determining whether to replenish components onto stage 156 from component supply apparatus 88 is performed using imaging device 84 and individual control device 452 included in loose component supply device 32, but whether to replenish components onto 156 from component supply apparatus 88 may be determined using imaging device 26 included in component mounter 10 and overall control device 450. That is, whether to replenish components onto stage 156 from component supply apparatus 88 may be determined by an imaging device and control device from other than loose component supply device 32. In this case, the component supply system is configured from loose component supply device 32 and the imaging device and control device from other than loose component supply device 32.

Also, in an embodiment above, components are scattered onto stage 156 from component supply apparatus 88 using conveyor device 106, but components may be supplied onto stage 156 from devices with various configurations. For example, components may be supplied onto stage 156 from a container by vibrating a container housing the components, or by changing the orientation of the container.

Further, in an embodiment above, stage 156 imaged by camera 290 is divided into 20×20 (400) regions, but may be divided into any quantity of blocks. The quantity of blocks may also be changed depending on the component size or the like. Also, 156 imaged by camera 290 is divided into substantially rectangular blocks, but the shape of the blocks is not particularly restricted.

Further, in an embodiment above, when an operator inserts leaded components 410 into component supply apparatus 88, component support member 150 is moved to the stored state, but the configuration may be such that an operator can insert leaded components 410 into component supply apparatus 88 whatever position component support member 150 is moved to.

Also, in an embodiment above, when component support member 150 is moved from the exposed state to the stored state when leaded components 410 are replenished onto stage 156 from both component collection container 180 and component supply apparatus 88, leaded components 410 are discharged from component support member 150, but leaded components 410 may be discharged from component supply apparatus 88 when component support member 150 is moved from the stored state to the exposed state. In other words, in an embodiment above, leaded components 410 discharged from component supply apparatus onto stage 156 may be temporarily collected in component collection container 180 and then replenished onto stage 156 from component collection container 180. However, by discharging leaded components 410 from component supply apparatus 88 when component support member 150 is moved from the stored state to the exposed state, leaded components 410 discharged from component supply apparatus 88 remain scattered on stage 156 without being collected in component collection container 180. That is, when component support member 150 is moved from the stored state to the exposed state, leaded components 410 are replenished onto stage 156 from component supply apparatus 88, and by the swinging of component collection container 180 leaded components 410 are replenished onto stage 156 from component collection container 180.

Also, in embodiments above, the present disclosure is applied to leaded components, but the present disclosure may be applied to various types of components. Specifically, for example, the present disclosure may be applied to configuration components of solar panels, configuration components of power modules, electronic components without leads, and so on.

REFERENCE SIGNS LIST

32: loose component supply device (component supply device);
84: imaging device;
88: component supply apparatus (replenishing device);
156: stage;
452: individual control device (determining device)

The invention claimed is:

1. A component supply system comprising:
a stage configured such that multiple components are loaded in a scattered state;
a replenishing device configured to replenish the components on the stage;
an imaging device configured to image the stage; and
a determining device configured to determine whether to replenish the components on the stage from the replenishing device based on first imaging data captured by the imaging device of the stage in a state without the components loaded on the stage, and based on second imaging data captured by the imaging device of the stage after the components have been replenished from the replenishing device.

2. The component supply system according to claim 1, wherein
a region captured by the imaging device is divided into multiple areas, and
the determining device is configured to
make a determination result of whether any of the components are present in each of the multiple areas based on the first imaging data and the second imaging data and
determine whether to replenish the components on the stage from the replenishing device based on the determination result.

3. The component supply system according to claim 2, wherein
the determining device is configured to determine that there are components present in the areas for which a difference value between the first imaging data and the second imaging data of each of the multiple areas is equal to or greater than a threshold value, and to replenish components on the stage from the replenishing device when a quantity of the areas in which the components are determined to be present is equal to or less than a set quantity.

4. The component supply system according to claim 3, wherein
the difference value includes a color difference, and
the determining device determines that there are components present in the areas for which the color difference between the first imaging data and the second imaging data of each of the multiple areas is equal to or greater than the threshold value.

5. The component supply system according to claim 3, wherein
the difference value includes a brightness difference and a color difference, and the determining device determines that there are components present in the areas for which at least one of the following is true: a brightness difference between the first imaging data and the second imaging data of each of the multiple areas is equal to or greater than a first threshold value; and a color difference between the first imaging data and the second imaging data of each of the multiple areas is equal to or greater than a second threshold value.

6. The component supply system according to claim 3, wherein
the determining device is configured to determine the set quantity based on component size data that represents a size of the component.

7. The component supply system according to claim 6, wherein
the determining device is configured to calculate the quantity of the areas that correspond to a surface area occupied by a specified quantity of the components on the stage based on the component size data, and
the calculated quantity of the areas is the set quantity.

* * * * *